United States Patent
Miyajima et al.

(10) Patent No.: US 6,667,252 B2
(45) Date of Patent: Dec. 23, 2003

(54) METHOD OF MANUFACTURING COMPOUND SEMICONDUCTOR SUBSTRATE

(75) Inventors: Takao Miyajima, Kanagawa (JP); Shigetaka Tomiya, Tokyo (JP); Akira Usui, Tokyo (JP)

(73) Assignees: Sony Corporation (JP); NEC Corporation (JP)

( * ) Notice: Subject to any disclaimer, the term of this patent is extended or adjusted under 35 U.S.C. 154(b) by 0 days.

(21) Appl. No.: 10/114,057

(22) Filed: Apr. 3, 2002

(65) Prior Publication Data

US 2002/0146912 A1 Oct. 10, 2002

(30) Foreign Application Priority Data

Apr. 6, 2001 (JP) ........................ P2000-108017

(51) Int. Cl.[7] ................ H01L 21/26; H01L 21/42; H01L 21/324; H01L 21/477
(52) U.S. Cl. ............ 438/796; 438/795; 438/940; 438/456; 438/458; 438/459; 438/463; 438/977
(58) Field of Search ............... 438/761, 762, 438/767, 796, 795, 940, 46, 456, 458, 459, 463, 479, 481, 977

(56) References Cited

U.S. PATENT DOCUMENTS 6,303,405 B1 * 10/2001 Yoshida et al. ............ 438/46

2001/0040246 A1 * 11/2001 Ishii .......................... 257/192

FOREIGN PATENT DOCUMENTS

JP    02002222773 A  *  8/2002

* cited by examiner

Primary Examiner—Amir Zarabian
Assistant Examiner—Khanh Duong
(74) Attorney, Agent, or Firm—Rader, Fishman & Grauer PLLC; Ronald P. Kananen

(57) ABSTRACT

A compound semiconductor substrate is manufactured by forming a higher-quality compound semiconductor layer having a smaller number of crystalline defects on a single-crystal substrate, and removing the single-crystal substrate without causing damage to the compound semiconductor layer. The method comprises the steps of forming the compound semiconductor layer (first, second and third compound semiconductor layers) on the single-crystal substrate (sapphire substrate) through crystal growth so as to partially have a space between the compound semiconductor layer and the single-crystal substrate; and removing the compound semiconductor layer from the sapphire substrate by irradiating the compound semiconductor layer from a side of the sapphire substrate with a laser beam passing through the single-crystal substrate and being absorbed in the compound semiconductor layer to melt an interface between the single-crystal substrate and the compound semiconductor.

5 Claims, 2 Drawing Sheets

METHOD OF MANUFACTURING COMPOUND SEMICONDUCTOR SUBSTRATE

BACKGROUND OF THE INVENTION

1. Field of the Invention

The present invention relates to a method of manufacturing a compound semiconductor substrate, and more specifically to a method of manufacturing a compound semiconductor substrate made of a gallium nitride substrate.

2. Description of the Related Art

There are great expectations for Gallium nitride (GaN) blue laser diodes as light sources of the next generation's high-density disc systems. Techniques for reducing crystalline defects density using Epitaxial Lateral Overgrowth (ELO) in gallium nitride blue laser diode devices are disclosed in "Japanese Examined Patent Application No. Hei 6-105797", "Japanese Unexamined Patent Application No. Hei 10-312971", "T. S. Zheleva et al., MRS Internet J. Nitride Semicond. Res. 4S1, G3.38 (1999)" and so on. Further, it is disclosed in "S. Nakamura et al., Proceedings of 2nd International Conference on Nitride Semiconductors, Tokushima (1997) p444" and "S. Nakamura et al., Jpn. J. Appl. Phys. 38 (1999) p226" that a practical life-span of the gallium nitride blue laser diode device can be obtained through the use of these techniques.

However, there are still a great number of problems which have to be solved in order to manufacture gallium nitride blue laser diode devices in volume at lower prices through the use of the above ELO. Specifically, it is known that sapphire substrates used as crystal growth substrates cause degradation in laser performance due to low thermal conductivity and cleavage planes susceptible to failure in their formation, etc.

As one of effective solutions to the problems, it is proposed that electrically conductive gallium nitride substrates with low defects density are manufactured in volume, and laser structures are formed on the electrically conductive gallium nitride substrates. In "A. Usui et al., Jpn. J. Appl. Phys. 36 (1997) L899." and "Japanese Unexamined Patent Application No. Hei 10-312971", a method of manufacturing a gallium nitride substrate through the use of HVPE (Hydride Vapor Phase Epitaxial growth) is disclosed, and an attempt of forming a laser structure on the gallium nitride substrate is disclosed in "M. Kuramoto et al., Jpn. J. Appl. Phys. 38 (1999) L184." In this case, the defects density in the gallium nitride substrate is about $10^7 cm^{-2}$, which is a higher value than the defects density of $10^6 cm^{-2}$ in a gallium nitride layer formed on a sapphire substrate through the use of ELO.

Further, after growing a thick-film gallium nitride layer on a sapphire substrate through the use of HVPE, there are no techniques established for easily removing the sapphire substrate from the thick-film gallium nitride layer, so the problem which has to be solved for mass production of the gallium nitride substrates still exists.

As one of the methods of removing the sapphire substrate from the gallium nitride layer, it is proposed that an excimer laser beam is applied to the back of the sapphire substrate to melt a substrate-nitride interface. However, it is difficult to remove the sapphire substrate in a diameter of 2 inches with high reproducibility. Moreover, a method of removing the sapphire substrate by polishing is an option, but the gallium nitride layer on the sapphire substrate has a large strain due to a difference in the thermal expansion coefficients between the gallium nitride layer and the sapphire substrate. Therefore, it is difficult to remove the sapphire substrate through the use of a typical polishing process.

As another method of manufacturing a gallium nitride substrate, a manufacturing method through the use of bulk growth under a high temperature and high pressure is disclosed in "S. Porowski, Mat. Sci. and Eng. B44 (1997) 407". It is disclosed in "S. Porowski et al., Mat. Res. Soc. Symp. Proc. 499 (1997) 35" that a low defects density in a range from $10^3 cm^{-2}$ to $10^5 cm^{-2}$ can be achieved in this method. However, in this method, a practical crystal size required to form a laser diode device cannot be achieved.

SUMMARY OF THE INVENTION

In view of the forgoing, it is an object of the present invention to provide a method of manufacturing a compound semiconductor substrate.

A method of manufacturing a compound semiconductor substrate according to the invention comprises the steps of: forming a compound semiconductor layer on a single-crystal substrate through crystal growth so as to partially have a space between the compound semiconductor layer and the single-crystal substrate; and removing the compound semiconductor layer from the single-crystal substrate by irradiating the compound semiconductor layer from a side of the single-crystal substrate with a laser beam passing through the single-crystal substrate and being absorbed in the compound semiconductor layer to melt an interface between the single-crystal substrate and the compound semiconductor.

As a first method of forming the above compound semiconductor layer, a method of manufacturing a compound semiconductor substrate comprises the steps of: growing a first compound semiconductor layer on a single-crystal substrate through crystal growth; dividing the first compound semiconductor layer into a stripe shape, and forming a stripe-shaped depressed portion by removing an upper part of the single-crystal substrate below an interval of the first compound semiconductor layers divided into a stripe shape; forming a second compound semiconductor layer by growing mainly in a lateral direction from the first compound semiconductor layer having a stripe shape while maintaining a space between the second compound semiconductor layer and the single-crystal substrate; forming an insulating film or a high-melting point metal film on a portion of the second compound semiconductor layer grown on the top side of the first compound semiconductor layer and a meeting portion of the second compound layer; and forming a third compound semiconductor layer on the second compound semiconductor layer through crystal growth.

As a second method of forming the above compound semiconductor layer, a method of manufacturing a compound semiconductor substrate comprises the steps of: forming a stripe-shaped projected portion by processing an upper part of a single-crystal substrate; forming a first compound semiconductor layer through crystal growth mainly in a lateral direction on a top side of the stripe-shaped projected portion; forming an insulating film or a high-melting-point metal film on a portion of the first compound semiconductor layer grown on the top side of the stripe-shaped projected portion through crystal growth and a meeting portion of the first compound semiconductor layer; and forming a second compound semiconductor layer on the first compound semiconductor layer through crystal growth.

In the above method of a compound semiconductor substrate, after forming an insulating film or a high-melting point metal film on a portion of a compound semiconductor layer where a great number of crystalline defects exist, in the first method, the third compound semiconductor layer is formed, and in the second method, the second compound semiconductor layer is formed. Thereby, a thick-film compound semiconductor layer having lower defects density can be grown. After that, a laser beam passing through the single-crystal substrate and being absorbed in the first compound semiconductor layer is applied to the first compound semiconductor layer from a side of the single-crystal substrate to melt an interface between the single-crystal substrate and the first compound semiconductor layer, and thereby, the first compound semiconductor layer can be removed from the single-crystal substrate. Therefore, the single-crystal substrate can be removed without causing damage to the thick-film compound semiconductor layer (the third compound semiconductor layer in the first method, and the second compound semiconductor layer in the second method).

Thus, even a large strain occurs due to a difference in the thermal expansion coefficients, for example, between the gallium nitride layer and the sapphire substrate, the sapphire substrate can be easily removed. More specifically, as the first compound semiconductor layer is joined with the single-crystal substrate not in whole but in part, a space exists in a portion where the first compound semiconductor layer is not joined with the single-crystal substrate. Thereby, a laser beam is absorbed only in a portion where the single-crystal substrate and the compound semiconductor layer are joined with each other, so the single-crystal substrate can be easily removed.

Other and further objects, features and advantages of the invention will appear more fully from the following description.

DETAILED DESCRIPTION OF THE PREFERRED EMBODIMENTS

A method of manufacturing a compound semiconductor substrate according to a first embodiment of the invention is described below referring to FIGS. 1A, 1B and 1C.

Figure 1A:
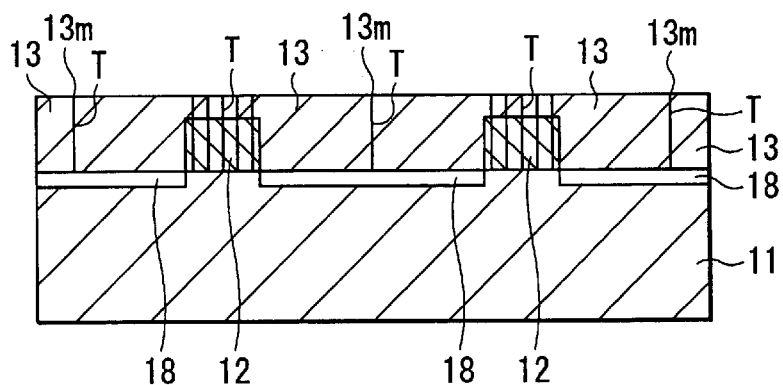
FIGS. 1A, 1B and 1C are schematic cross-sectional views of structures showing a method of manufacturing a compound semiconductor substrate according to a first embodiment of the invention.

As shown in FIG. 1A, a first compound semiconductor layer 12 which is a seed crystalline layer is formed on a c-plane of a single-crystal substrate (hereinafter referred to as sapphire substrate) 11 by MOCVD (Metal Organic Chemical Vapor Deposition). In this case, a 300 $\mu$m thick sapphire substrate is used, and as an example, gallium nitride (GaN) of Group III–V nitride semiconductor is grown to a thickness of, for example, about 2 $\mu$m through crystal growth to form the first compound semiconductor layer 12. The Group III–V nitride semiconductor contains at least one element selected from Group III elements such as gallium (Ga), aluminum (Al), boron (B) and indium (In), w and at least nitrogen (N) selected from Group V elements. Although the above MOCVD can be carried out under any of normal, reduced and compressed atmospheric pressures, crystals of higher quality can be obtained by carrying out MOCVD under a compressed atmospheric pressure.

Next, an insulating film (not shown) made of a silicon nitride film or a silicon oxide film is formed through the use of CVD (Chemical Vapor Deposition). The insulating film may be a laminate of a silicon nitride film and a silicon oxide film. Further, a high-melting-point metal film such as titanium and tungsten can be used. Then, after forming a resist film (not shown) by resist coating, a stripe-shaped resist pattern (not shown) with predetermined intervals is formed by lithography. As an example, a 2.5 $\mu$m thick resist pattern with intervals of 13.5 $\mu$m is formed. After that, the above insulating film is etched into a stripe shape by using the resist pattern as a mask. This step is carried out by, for example, reactive ion etching.

Moreover, after removing the above resist pattern, the above first compound semiconductor layer 12 is etched into a stripe shape by using the insulating film as a mask. Further, an upper part of the sapphire substrate 11 is etched by using the above insulating film as a mask. The etching depth of the sapphire substrate 11 is preferably 10 nm or over, more preferably 100 nm or over, and the most preferably from 200 nm to 1000 nm, inclusive. Thus, in the case where the etching depth of the sapphire substrate 11 is 10 nm or over, a crystal growth layer is kept from contact with the sapphire substrate 11, when the crystal growth layer grows in a lateral direction from the first compound semiconductor layer 12, which will be described later. It is required that the etching depth is just as deep as the above crystal growth layer does not contact with the sapphire substrate 11, so the sapphire substrate 11 is not required to be etched deeper than necessary. Therefore, the etching depth is 1000 nm or less. The etching step is carried out by reactive ion etching using, for example, chlorine gas, and a substrate temperature is set at 0° C., and the etching atmospheric pressure is set at 0.5 Pa. After that, the above insulating film is removed by, for example, wet etching.

Next, the gallium nitride crystals are grown mainly in a lateral direction from the first compound semiconductor layers 12 divided into a stripe shape to form a second compound semiconductor layer 13. At this time, a portion of the second compound semiconductor layer 13 grown from a sidewall of the first compound semiconductor layer 12 can be formed faster than a portion of the second compound semiconductor layer 13 grown from a top side of the first compound semiconductor layer 12, so, after a certain time period, another portion of the second compound semiconductor layer 13 grown from a sidewall of another first compound semiconductor layer 12 adjacent to the first compound semiconductor layer 12 meets the portion of the second compound semiconductor layer 13, and the growing faces of the second semiconductor layers 13 become flat. For example, a crystal growth proposed by T. S. Zheleva et al. [MRS Internet J. Nitride Semicond. Res. 4S1, G3. 38 (1999)] can be used as this crystal growth.

At this time, in a portion of the second compound semiconductor layer 13 grown in a lateral direction, a threading dislocation which is a crystalline defect is reduced to $10^6$ cm$^{-2}$ or less. On the other hand, in the first compound semiconductor layer 12, a portion of the second compound semiconductor layer 13 grown on the top side of the first compound semiconductor layer 12, and a meeting portion 13m of the second compound semiconductor layer 13, crystalline defects are generated in large quantity (for example, the crystalline defects density is more than $10^6$ cm$^{-2}$).

Figure 1B:
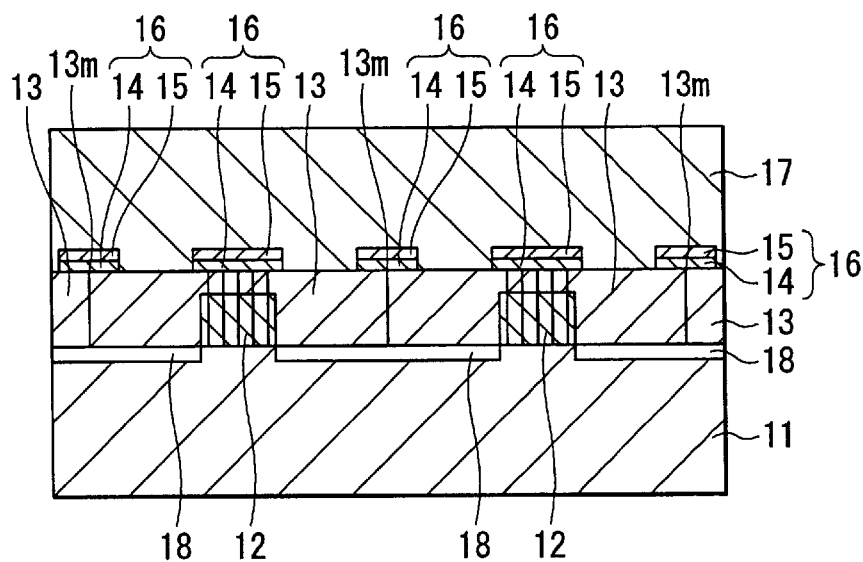

Then, as shown in FIG. 1B, a silicon oxide film 14 and a silicon nitride film 15 are laminated on the second compound semiconductor layer 13. Incidentally, the laminated films may be replaced with a single-layer silicon oxide film or a single-layer silicon nitride film, but in order to suppress a tilt of a c-axis, as described above, a laminate of the silicon oxide film and the silicon nitride film is preferable. Next, after forming a resist film (not shown) on the silicon nitride film 15 by resist coating, a stripe-shaped resist pattern (not shown) is formed on the top side of the first compound semiconductor layer 12 and the top side of the meeting portion 13m of the second compound semiconductor layer 13 by lithography. After that, the silicon oxide film 14 and the silicon nitride film 15 are etched into a stripe shape by using the resist pattern as a mask. This etching step is carried out by, for example, reactive ion etching. Thus, an area where crystalline defects are remained in large quantity is covered with a mask 16 made of the silicon oxide film 14 and the silicon nitride film 15. Further, as the outermost surface of the mask 16 is formed so as to be covered with the silicon nitride film 15, fluctuations of the c-axis in a gallium nitride layer growing on the silicon nitride film 15 can be prevented, which is disclosed in Japanese Unexamined Patent Application Publication No. 2000-164988.

Next, on the top side of the second compound semiconductor layer 13, on which the mask 16 is formed, a third compound semiconductor layer 17 made of a thick gallium nitride film is grown in a thickness ranging, for example, from 10 μm to 1 mm by HVPE. At this time, in order to control the conductivity of the third compound semiconductor layer 17, it is preferable to dope the third compound semiconductor layer 17 with donors.

For example, as n-type donors, at least one element selected from the group consisting of carbon (C), silicon (Si), germanium (Ge) and tin (Sn) which are Group IV elements, and sulfur (S), selenium (Se) and tellurium (Te) which are Group VI elements is used. As p-type donors, at least one element selected from the group consisting of carbon (C), silicon (Si), germanium (Ge) and tin (Sn) which are Group IV elements, and beryllium (Be), magnesium (Mg), calcium (Ca), Zinc (Zn) and cadmium (Cd) which are Group II elements is used. As raw materials of the n-type donors and p-type donors, simple substances, organic compounds or hydrides of the above elements can be used.

In this case, since the mask 16 made of the silicon oxide film 14 and the silicon nitride film 15 laminated in this order is used, as disclosed in "A. Sakai et al., Appl. Phys. Lett. 71 (1997) 2259.", fluctuations of the c-axis in the gallium nitride film on the mask 16 can be prevented, and thereby, crystals of higher quality can be obtained.

The above HVPE has an advantage that the gallium nitride can be grown to a thickness of a few μm to a few hundreds μm per hour, so HVPE is considered as an effective method of forming a gallium nitride substrate. As a raw material of HVPE, a single substance of a Group III element such as boron, aluminum, gallium and indium, or an organometallic compound containing a Group III element is used. Moreover, as a hydride gas, hydrogen chloride (HCl), hydrogen fluoride (HF), hydrogen bromide (HBr), hydrogen iodide (HI) or the like is used. Further, as a material of nitrogen, ammonia, a raw material of hydrazines expressed by a common formula of $N_2R_4$ (where R is H or an arkyl group) for hydrazine-di-methyl-hydrazine-mono-methyl-hydrazine, an organic amine or the like is used. As the organic amine, propylamine, isopropylamine, butylamine, isobutylamine, tert-butylamine, or sec-butylamine, etc. all of which are the primary amines is used. Also, secondary amines are dipropylamine, diisopropylamine, dibutylamine, diisobutylamine, di-tert-butylaimne, di-sec-butylamine, etc. Moreover, tertiary amines are tripropylamine, triisopropylamine, tributylamine, triisobutylamine,tri-tert-butylamine,tri-sec-butylamine, triallylamine, triethylamine, diisopropylmethylamine, dipropylmethylamine, dibutylmethylamine, diisobutylmethylamine, di-sec-butylmethylamine, di-tert-butylmethylamine, etc.

As an example of conditions for forming the third compound semiconductor layer 17 by HVPE, a single substance of gallium is heated to about 800° C., and hydrogen chloride (HCl) (the flow rate: 20 μmol/min) as a halide gas, ammonia ($NH_3$) (the flow rate: 1 dm$^3$/min) as a nitrogen source and nitrogen ($N_2$) (the flow rate: 0.5 dm$^3$/min) are used, then the substrate temperature is set at 980° C.

Figure 1C:
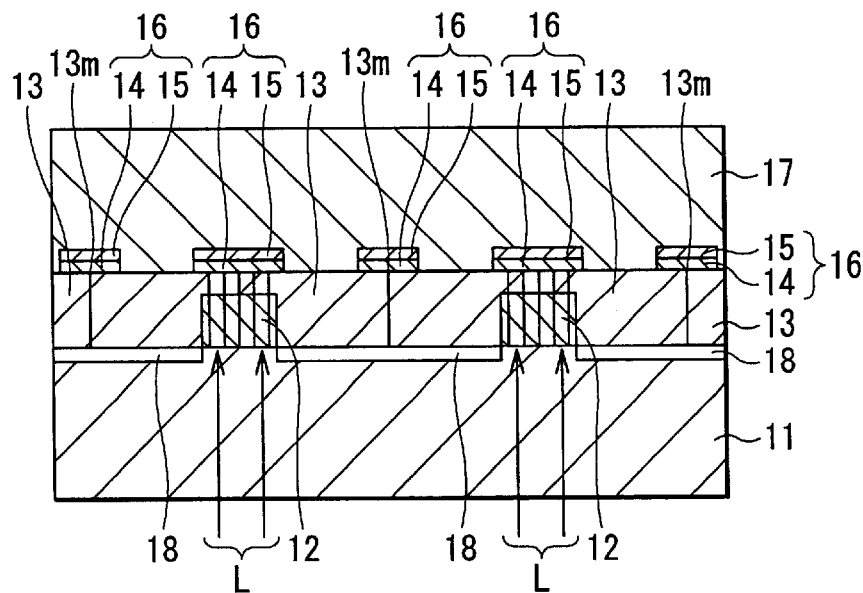

Next, as shown in FIG. 1C, a laser beam L is applied from the back of the sapphire substrate 11. As the laser beam L, a laser beam having a wavelength which can pass through the sapphire substrate 11, and then can be absorbed in an interface between the sapphire substrate 11 and the first compound semiconductor layer 12, and an energy which can melt the first compound semiconductor layer 12 near the interface is used. The transmittance of sapphire in the sapphire substrate 11 declines at a wavelength of 200 nm or less, and is reduced to about 30% at a wavelength of 150 nm. The transmittance spectrum of gallium nitride steeply declines at a wavelength of 360 nm, and a wavelength of 360 nm or less hardly passes through. Therefore, for example, a krypton fluoride (KrF) excimer laser beam with a lasing wavelength of 248 nm, third harmonic generation of a $Nd^{3+}$:YAG (Yttrium Aluminium Garnet) laser beam with a lasing wavelength of 355 nm, etc. can be used as the laser beam L. The irradiating energy, irradiating time and so on of the above laser beams can be selected depending on conditions for melting the first compound semiconductor layer 12 near the interface.

Then, a space 18 is formed between the second compound semiconductor layer 13 and the sapphire substrate 11, and the first compound semiconductor layer 12 is joined with the sapphire substrate 11 only in part, so a portion of the first compound semiconductor layer 12 in the vicinity of the interface with the sapphire substrate 11 is melted by the irradiation of the laser beam L, and thereby, the sapphire substrate 11 can be removed from the first compound semiconductor layer 12 without causing much damage to the second and third compound semiconductor layers 13 and 17.

In the above method of manufacturing a compound semiconductor substrate, after the mask 16 made of an insulating film or a high-melting-point metal film is formed on a portion of the second compound semiconductor layer 13 disposed on the top side of the first compound semiconductor layer 12 and the meeting portion 13m of the second compound semiconductor layer 13 where a great number of crystalline defects exist, the third compound semiconductor layer 17 is formed on the second compound semiconductor layer 13. Thereby, the third compound semiconductor layer 17 becomes a thick-film compound semiconductor layer with a lower defects density. After that, the laser beam L, which passes through the sapphire substrate 11, and is absorbed in the first compound semiconductor layer 12, is applied to the first compound semiconductor layer 12 from a side of the sapphire substrate 11 to melt the interface between the sapphire substrate 11 and the first compound semiconductor layer 12, and thereby, the first compound semiconductor layer 12 is removed from the sapphire substrate 11. Therefore, the sapphire substrate 11 can be removed without causing damage to the thick-film third compound semiconductor layer 17.

Thus, even a large strain occurs due to a difference in the thermal expansion coefficients, for example, between the gallium nitride layer and the sapphire substrate, the sapphire substrate 11 can be easily removed. More specifically, as the first compound semiconductor layer 12 is joined with the sapphire substrate 11 not in whole but in part, a space exists in a portion where the first compound semiconductor layer 12 is not joined with the sapphire substrate 11. Thereby, the laser beam L is absorbed only in a portion where the sapphire substrate 11 and the first compound semiconductor layer 12 are joined with each other, so the sapphire substrate 11 can be easily removed.

Further, through the use of the method of manufacturing a compound semiconductor substrate according to the first embodiment, a gallium nitride substrate having higher thermal conductivity and a lower defects density can be manufactured. That is, the third compound semiconductor layer 17 can be made as the gallium nitride substrate having higher thermal conductivity and a lower defects density. By using the gallium nitride substrate, a LED (Light Emitting Diode), a laser structure and a FET (Field Effect Transistor) made on the gallium nitride substrate can have higher device characteristics, compared with those made on a conventional sapphire substrate or silicon carbide substrate.

Figure 2A:
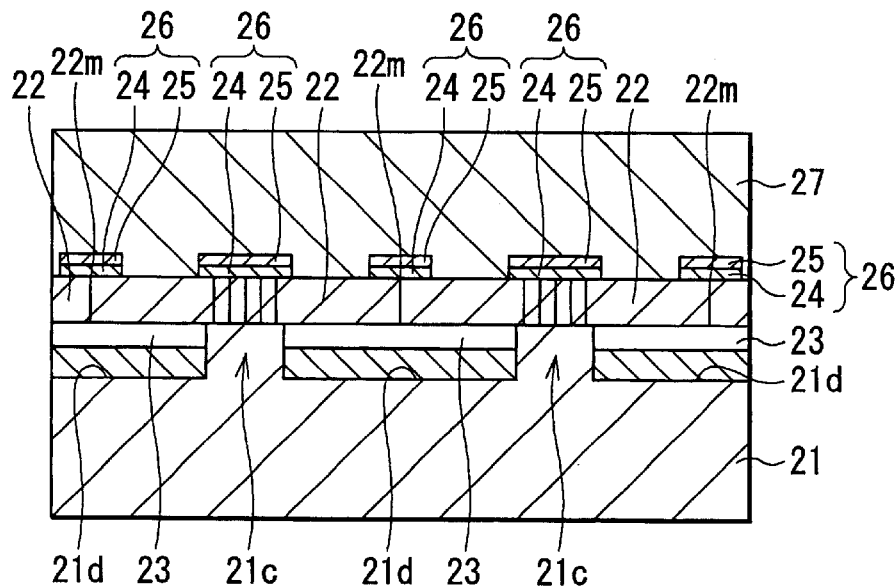
FIGS. 2A and 2B are schematic cross-sectional views of structures showing a method of manufacturing a compound semiconductor substrate according to a second embodiment of the invention.
Figure 2B:
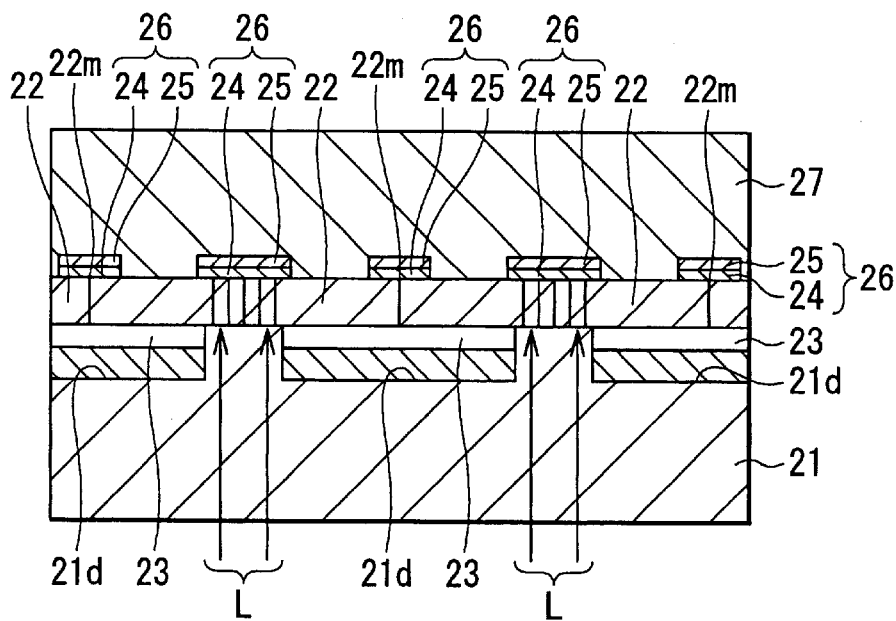

Next, a method of manufacturing a compound semiconductor substrate according to a second embodiment of the invention is described referring to FIGS. 2A and 2B.

As shown in FIG. 2A, an insulating film (not shown) made of a silicon nitride film or a silicon oxide film is formed on a sapphire substrate 21 through the use of CVD. The insulating film may be a laminate of a silicon nitride film and a silicon oxide film. Then, after forming a resist film (not shown) on the insulating film by resist coating, a stripe-shaped resist pattern (not shown) with predetermined intervals is formed by lithography. As an example, a 2.5 $\mu$m thick resist pattern with intervals of 7.5 $\mu$m is formed. After that, the above insulating film is etched into a stripe shape by using the resist pattern as a mask. This step is carried out by, for example, reactive ion etching. After removing the resist pattern, the sapphire substrate 21 is etched through the use of the above insulating film as a mask to form a groove-shaped depressed portion 21d, that is, a stripe-shaped projected portion 21c. The height of the projected portion 21c is determined by the thickness of a compound semiconductor layer formed through crystal growth. That is, the depressed portion 21d is formed in a depth so as to form a space below the underside of the compound semiconductor layer. In this case, as an example, the height of the projected portion 21c is about 3 $\mu$m.

Next, a low-temperature buffer layer (not shown) is grown on a top side of the projected portion 21c, and a first compound semiconductor layer 22 made of gallium nitride is grown mainly in a lateral direction. At this time, the low-temperature buffer layer (not shown) and the first compound semiconductor layer 22 made of gallium nitride are formed on a bottom side of the depressed portion 21d of the sapphire substrate 21, although a space 23 is formed between the underside of the first compound semiconductor layer 22 grown in a lateral direction and the sapphire substrate 21. It is described in "Yano et al., Digest of 61st Annual Meeting of Japan Society of Applied Physics (2000.9) 5p-Y-5" and "Okagawa et al., Digest of 61st Annual Meeting of Japan Society of Applied Physics (2000.9) 5p-Y-6" that the first compound semiconductor layer 22 grows in a lateral direction in this manner.

Crystalline defects T are generated in large quantity (for example, the crystalline defects density is $10^6$ cm$^{-2}$ or over) in a portion of the first compound semiconductor layer 22 grown on the top side of the projected portion 21c of the sapphire substrate 21 and a meeting portion 22m of the first compound semiconductor layer 22.

Therefore, by the same method as that described in the first embodiment, a stripe-shaped mask 26 made of a silicon oxide film 24 and a silicon nitride film 25 is formed on the portion of the first compound semiconductor layer 22 disposed on the top side of the projected portion 21c of the sapphire substrate 21, and the meeting portion 22m of the first compound semiconductor layer 22, where a great number of crystalline defects T remain.

Next, by the same HVPE as that described in the first embodiment, a second compound semiconductor layer 27 is formed on the top side of the first compound semiconductor layer 22, on which the mask 26 is formed, by growing gallium nitride in a thickness ranging of 10 $\mu$m to 1 mm, for example. At this time, in order to control the conductivity of the second compound semiconductor layer 27, it is preferable to dope the second compound semiconductor layer 27 with the same donors as those described in the first embodiment. In this case, the mask made of the silicon oxide film 24 and the silicon nitride film 25 laminated in this order is used, so fluctuations of a c-axis in the second compound semiconductor layer 27 disposed on the mask 26 can be prevented, and thereby, crystals of higher quality can be obtained.

Next, as shown in FIG. 2B, a laser beam L is applied from the back of the sapphire substrate 21. The same laser beam as that described in the first embodiment is used for the laser beam L. As a result, a portion of the first compound semiconductor layer 22 where the interface with the sapphire substrate 21 exists is melted, and the sapphire substrate 21 can be easily removed without causing much damage to a portion of the first compound semiconductor layer 22 grown in a lateral direction on the sapphire substrate 21 with the space 23 sandwiched in between and the second compound semiconductor layer 27.

In the above method of manufacturing a compound semiconductor substrate, after forming the mask 26 made of an insulating film or a high-melting-point metal film on a portion of the first compound semiconductor layer 22 disposed on the top side of the projected portion 21c of the sapphire substrate 21, where a great number of crystalline defects exist, and the meeting portion 22m of the first compound semiconductor layer 22, the second compound semiconductor layer 27 is formed on the first compound semiconductor layer 22. Thereby, the second compound semiconductor layer 27 becomes a thick-film compound semiconductor layer with a lower defects density. After that, the laser beam L, which passes through the sapphire substrate 21 and is absorbed in the first compound semiconductor layer 22, is applied to the first compound semiconductor layer 22 from a side of the sapphire substrate 21 to melt the interface between the sapphire substrate 21 and the first compound semiconductor layer 22, and thereby, the first compound semiconductor layer 22 is removed from the sapphire substrate 21. Therefore, the sapphire substrate 21 can be removed without causing damage to the thick-film second compound semiconductor layer 27.

Thus, even a large strain occurs due to a difference in the thermal expansion coefficient between, for example, the gallium nitride layer and the sapphire substrate, the sapphire substrate 21 can be easily removed. More specifically, as the first compound semiconductor layer 22 is joined with the sapphire substrate 21 not in whole but in part, a space exists in a portion where the first compound semiconductor layer 22 is not joined with the sapphire substrate 21. Thereby, the laser beam L is absorbed only in a portion where the sapphire substrate 21 and the first compound semiconductor layer 22 are joined with each other, so the sapphire substrate 21 can be easily removed.

Further, through the use of the method of manufacturing a compound semiconductor substrate which is described in the second embodiment, a gallium nitride substrate having higher thermal conductivity and a lower defects density can be manufactured. That is, the second compound semiconductor layer 27 can be made as the gallium nitride substrate having higher thermal conductivity and a lower defects density. By using the gallium nitride substrate, a LED (Light Emitting Diode), a laser structure and a FET (Field Effect Transistor) made on the gallium nitride substrate can have higher device characteristics, compared with those made on a conventional sapphire substrate or silicon carbide substrate.

As described above, according to a method of manufacturing a compound semiconductor substrate of the invention, a thick-film compound semiconductor layer having a low defects density can be grown on a single-crystal substrate (sapphire substrate) in a diameter of 2 inches or over through crystal growth, and after that, the single-crystal substrate can be removed without causing damage to the thick-film compound semiconductor layer. Thus, even if a large strain occurs due to a difference in the thermal expansion coefficients, for example, between the gallium nitride layer and the sapphire substrate, the sapphire substrate can be easily removed. More specifically, as the first compound semiconductor layer is joined with the single-crystal substrate not in whole but in part, a space exists in a portion where the first compound semiconductor layer is not joined with the single-crystal substrate. Thereby, a laser beam is absorbed only in a portion where the single-crystal substrate and the first compound semiconductor layer are joined with each other, so the single-crystal substrate can be easily removed. Therefore, a compound semiconductor substrate having a smaller number of crystalline defects can be manufactured.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a compound semiconductor substrate comprising the steps of:
   forming a compound semiconductor layer on a single-crystal substrate through crystal growth so as to partially have a space free of solid materials between the compound semiconductor layer and the single-crystal substrate; and
   removing the compound semiconductor layer from the single-crystal substrate by irradiating the compound semiconductor layer from a side of the single-crystal substrate with a laser beam passing through the single-crystal substrate and being absorbed in the compound semiconductor layer to melt an interface between the single-crystal substrate and the compound semiconductor.

2. A method of manufacturing a compound semiconductor substrate comprising the steps of:
   growing a first compound semiconductor layer on a single-crystal substrate through crystal growth;
   dividing the first compound semiconductor layer into a stripe shape, and forming a stripe-shaped depressed portion by removing an upper part of the single-crystal substrate below an interval of the first compound semiconductor layer divided into a stripe shape;
   forming a second compound semiconductor layer by growing the first compound semiconductor layer of a stripe shape mainly in a lateral direction through crystal growth while maintaining a space between the second compound semiconductor layer and the single-crystal substrate;
   forming an insulating film or a high-melting point metal film on a portion of the second compound semiconductor layer grown on a top side of the first compound semiconductor layer and a meeting portion of the second compound layer; and
   forming a third compound semiconductor layer on the second compound semiconductor layer through crystal growth.

3. A method of manufacturing a compound semiconductor substrate according to claim 2, further comprising the step of:
   removing the first compound semiconductor layer from the single-crystal substrate by irradiating the first compound semiconductor layer from a side of the single-crystal substrate with a laser beam passing through the single-crystal substrate and being absorbed in the first compound semiconductor layer to melt an interface between the single-crystal substrate and the first compound semiconductor.

4. A method of manufacturing a compound semiconductor substrate comprising the steps of:
   forming a stripe-shaped projected portion by processing an upper part of a single-crystal substrate;
   forming a first compound semiconductor layer through crystal growth mainly in a lateral direction on a top side of the stripe-shaped projected portion;
   forming an insulating film or a high-melting-point metal film on a portion of the first compound semiconductor layer grown on the top side of the stripe-shaped projected portion through crystal growth and a meeting portion of the first compound semiconductor layer; and
   forming a second compound semiconductor layer on the first compound semiconductor layer through crystal growth.

5. A method of manufacturing a compound semiconductor substrate according to claim 4, further comprising the step of:
   removing the first compound semiconductor layer from the single-crystal substrate by irradiating the first compound semiconductor layer from a side of the single-crystal substrate with a laser beam passing through the single-crystal substrate and being absorbed in the first compound semiconductor layer to melt an interface between the single-crystal substrate and the first compound semiconductor.

* * * * *